United States Patent [19]
Miyazaki

[11] Patent Number: 5,642,001
[45] Date of Patent: Jun. 24, 1997

[54] OVERDRIVE CIRCUIT

[75] Inventor: Takahiro Miyazaki, Haji-machi, Japan

[73] Assignee: Texas Instruments Incorporated, Dallas, Tex.

[21] Appl. No.: 324,835

[22] Filed: Oct. 18, 1994

[51] Int. Cl.$^6$ .................................................. H03K 17/08
[52] U.S. Cl. ..................... 307/43; 307/141; 307/141.4; 307/141.8; 327/108; 327/109; 327/289; 326/62; 330/207 P; 361/154
[58] Field of Search ........................ 307/44–87, 141, 307/141.4, 141.8; 361/154; 326/62; 327/108, 109; 323/289; 330/207 P

[56] References Cited

U.S. PATENT DOCUMENTS 4,925,156 5/1990 Stoll et al. ................. 251/129.01
5,053,911 10/1991 Kopec et al. ................. 361/154

*Primary Examiner*—Jonathan Wysocki
*Assistant Examiner*—Albert W. Paladini
*Attorney, Agent, or Firm*—William E. Hiller; Richard L. Donaldson

[57] ABSTRACT

An overdrive circuit having a first current source which supplies an overdrive current and a second current source which supplies an ordinary current smaller than the overdrive current. A first circuit operates the first current source that supplies the overdrive current for a predetermined time period after the start of current supply. A second circuit stops the action of the first current source after the predetermined time period has passed and drives the second current source to supply the ordinary current as the driving current.

9 Claims, 3 Drawing Sheets

OVERDRIVE CIRCUIT

This invention pertains to an overdrive circuit which operates switching elements, such as a switching regulator, at a high rate of speed.

BACKGROUND OF THE INVENTION

Conventionally, when the collector voltage of pnp or npn transistors used as switching elements installed outside of the IC in switching regulators, etc., is changed (increased or decreased) at high speed, a high speed operation has been done by temporarily increasing the base current of the external transistor by adding an external capacitive element (capacitor) to the drive circuit.

FIG. 5 is a circuit diagram which illustrates the first structural example of a conventional overdrive circuit.

In FIG. 5, $I_{e1}$ is the current source, $Q_1$, $Q_2$ are npn transistors, $D_1$ is a diode, $R_1$ is a resistance element, $C_1$ is an external capacitor, $QPT_1$ is an external pnp transistor, $SD_1$ is a Schottky diode, $L_1$ is a coil, $C_2$ is a capacitor, $V_{CC}$ is the power source voltage, $T_1$, $T_2$, and $T_3$ are the input/output terminals of the IC (IC terminals, hereafter).

In this circuit, the current source $I_{e1}$, npn transistors $Q_1$, $Q_2$, diode $D_1$, and the resistance element $R_1$ are formed inside of the IC, and each element is connected as follows:

That is, the collector and the base of the transistor $Q_1$ are connected to the current source $I_{e1}$, and the emitter is connected to the anode of the diode $D_1$. The cathode of the diode $D_1$ is grounded.

The connection midpoints of the collector and the base of the transistor $Q_1$ are connected to the base of the transistor $Q_2$. The collector of the transistor $Q_2$ is connected to the IC terminal $T_1$, the emitter is connected to one end of the resistance element $R_1$ and the IC terminal $T_2$, and the other end of the resistance element $R_1$ is grounded.

The electrode at one side of the external capacitor $C_1$ is connected to the IC terminal $T_2$, and the other electrode is connected to the IC terminal $T_3$.

The emitter of the external transistor $QPT_1$ is connected to the supply line of the power source voltage $V_{CC}$, the base is connected to the IC terminal $T_1$, and the collector is connected to the cathode of the Schottky diode $SD_1$ and one end of the coil $L_1$. The anode of the Schottky diode $SD_1$ is grounded, the other end of the coil $L_1$ is connected to one electrode of the capacitor $C_2$, the other electrode of the capacitor $C_2$ is grounded, and the connection midpoint of the other end of the coil $L_1$ and one electrode of the capacitor $C_2$ is connected to a load not illustrated in the figure.

In such a structure, the electric current from the current source $I_{e1}$ is supplied to the collector and the base of the transistor $Q_1$, and the base of the transistor $Q_2$.

In this manner, both transistors $Q_1$ and $Q_2$ will be on, and the base emitter voltage $V_{BE}$ portion of the diode $D_1$ will be impressed on both ends of the resistance terminal $R_1$ as the voltage $V_1$.

At this time, in the initial state, while the charge flows into the transistor $Q_2$, the overdrive current $I_{OVR}$ such as illustrated in FIG. 6 will flow into the external capacitor $C_1$, and this current is supplied to the base of the external transistor $QPT_1$.

Therefore, the collector voltage $V_{P1}$ of the external transistor $QPT_1$ will rapidly rise as illustrated in FIG. 7.

In this manner, high-speed operation is realized and conversion efficiency will increase.

FIG. 8 is a circuit diagram illustrating the second structural example of a conventional overdrive circuit.

In FIG. 8, $I_{e2}$ is a current source, $P_1$ is a pnp transistor, $Q_3$ and $Q_4$ are npn transistors, $D_2$ and $D_3$ are diodes, $R_2$ is a resistance element, $C_3$ is an external capacitor, $QPT_1$ is an external pnp transistor, $SD_1$ is a Schottky diode, $L_1$ is a coil, $C_2$ is a capacitor, $V_{CC}$ is power source voltage, and $T_1$, $T_2$, and $T_3$ indicate input/output terminals of the IC.

In the structure of this circuit, the transistors $Q_1$ and $Q_2$ and the diode $D_1$ in the circuit in FIG. 5 are replaced by the diode $D_3$, transistor $P_1$, and diode $D_2$. The external capacitor $C_3$ and the resistance element $R_2$ play similar roles to those of the external capacitor $C_1$ and the resistance element $R_1$ in FIG. 5. The connecting relationship between each element in the IC is different from that in the circuit in FIG. 5.

That is, the anode of the diode $D_2$ is connected to the power source voltage $V_{CC}$, and the cathode is connected to the anode of the diode $D_3$. The cathode of the diode $D_3$ is connected to both the current source $I_{e2}$ and the base of the transistor $P_1$.

The emitter of the transistor $P_1$ is connected to one end each of the resistance element $R_2$ and the IC terminal $T_3$, and the collector is connected to both the collector and the base of the transistor $Q_3$. The other end of the resistance element $R_2$ is connected to the power source voltage $V_{CC}$ and the IC terminal $T_2$.

One electrode of the external capacitor $C_3$ is connected to the IC terminal $T_2$, and the other electrode is connected to the IC terminal $T_3$.

The emitter of the transistor $Q_3$ is grounded, and the connection midpoint between the collector and the base is connected to the base of the transistor $Q_4$. The collector of the transistor $Q_4$ is connected to the IC terminal $T_1$, and the emitter is grounded.

In the circuit in FIG. 8, when the electric current from the current source $I_{e2}$ begins to flow, in the initial state, during the time while the charge of the external capacitor $C_3$ flows out via the transistor $P_1$, the overdrive current $I_{OVR}$ as illustrated in FIG. 9 will flow into the collector of the transistor $P_1$.

That is, with regard to the collector current $I_{P1}$ of the transistor $P_1$, as illustrated in FIG. 9, the overdrive current $I_{OVR}$ will flow temporarily. Such a collector current $I_{P1}$ of the transistor $P_1$ is amplified by the transistors $Q_3$ and $Q_4$, which constitute a current mirror circuit, and is supplied to the base of the external transistor $QPT_1$ as the current $I_{Q4}$.

Therefore, the collector voltage $V_{P1}$ of the external transistor $QPT_1$ will rise quickly as illustrated in FIG. 7, and consequently, high speed operation is realized, and the conversion efficiency will increase.

Recently, in the field of portable equipment such as video cameras, the trend is to make the mounting area smaller by reducing as many external parts of the IC as possible.

However, with regard to the aforementioned conventional circuits, several hundred to several thousand pF will be needed as the capacitance for the capacitor $C_1$ in the circuit in FIG. 5, and several tens to several hundred pF will be needed as the capacitance for the capacitor $C_3$ in the circuit in FIG. 8. While it is possible to form a capacitor of several tens of pF inside the IC, this will result in an increased chip area, and consequently an increase in the IC cost. Therefore, it is inevitable that the aforementioned capacitors are attached outside the IC, meaning that a structure which is not desirable for the actual situation will be adopted, and which is a reason why the equipment is made larger.

It is an object of the present invention to provide an overdrive circuit that can have the number of external parts decreased without increasing the chip area or the IC cost.

SUMMARY OF THE INVENTION

An overdrive circuit in accordance with the invention has a switching element, a first current source which supplies a first current, a second current source which supplies a second current which is smaller than the first current, a first circuit which operates the first current source for a predetermined time period from the time of the starting of the driving of the switching element, and supplies the first current as the driving current for the switching element, and a second circuit which stops the operation of the first current source by means of the first circuit after the predetermined time period has expired, operates the second current source, and supplies the second current as the driving current for the switching element.

With the overdrive circuit in accordance with the invention, when the supply of driving current to the switching element is started, the first current source is initially driven by the first circuit.

Consequently, the first current, which is a large value, is supplied from the first current source to the external switching element as overdrive current.

After a predetermined time has passed from the start of supplying the first current, the operation of the first current source by the first circuit is stopped by the second circuit. At the same time, the second current source is driven by the second circuit.

Consequently, the second current, which has a smaller value than the first current, is supplied from the second current source to the external switching element as ordinary current.

| | |
|---|---|
| $I_{e11}$ | Current source |
| $Q_{11} - Q_{14}$ | npn transistor |
| $PG_{11}, PG_{12}$ | pnp transistor group |
| $R_{11}-R_{14}$ | Resistance element |
| MR | Current mirror circuit |
| $QM_{11} - QM_{16}$ | npn transistor for current mirror circuit MR |
| $QPT_1$ | External pnp transistor |
| $QNT_1$ | External npn transistor |
| $T_1$ | IC terminal |
| $V_{CC}$ | Power source voltage |

DESCRIPTION OF PREFERRED EMBODIMENTS

Figure 1:
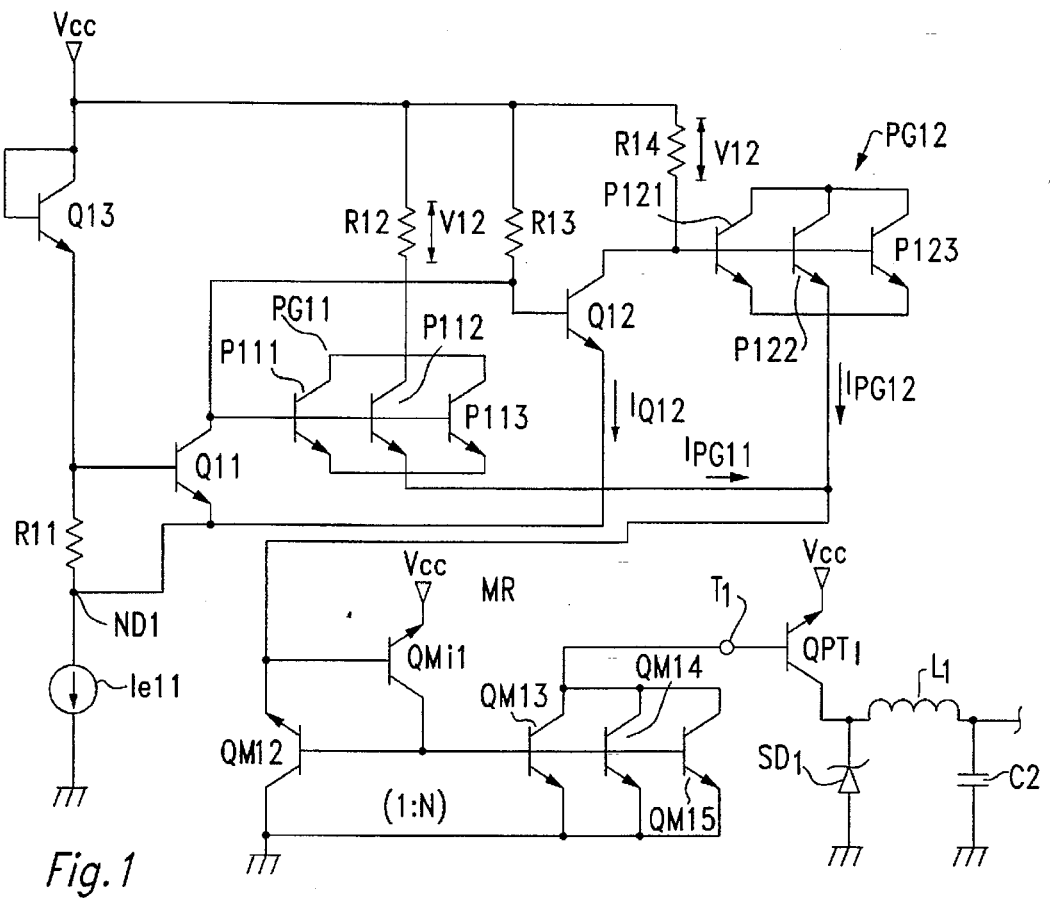
FIG. 1 is a circuit diagram of a first embodiment of an overdrive circuit in accordance with the invention.

FIG. 1 is a circuit diagram of a first embodiment of an overdrive circuit in accordance with the invention.

In FIG. 1, $I_{e11}$ is a current source, $Q_{11}$–$Q_{13}$ are npn transistors, $PG_{11}$ and $PG_{12}$ are pnp transistor groups, $R_{11}$–$R_{14}$ are resistance elements, $Q_{M11}$–$Q_{M15}$ are npn transistors for the current mirror circuit MR, $QPT_1$ is an external pnp transistor, $T_1$ is an IC terminal, and $V_{CC}$ is the power source voltage.

The pnp transistor group $PG_{11}$ is configured by connecting the bases to bases, the emitters to emitters, and the collectors to collectors of the pnp transistors $P_{111}$–$P_{113}$, respectively.

Similarly, the pnp transistor group $PG_{12}$ is configured by connecting the bases to bases, the emitters to emitters, and the collectors to collectors of the pnp transistors $P_{121}$–$P_{123}$, respectively.

The bases to bases, the emitters to emitters, and the collectors to collectors of the npn transistors $Q_{M13}$–$Q_{M15}$ of the current mirror circuit MR are also connected.

The collector of the npn transistor $Q_{11}$ is connected to each of the connection midpoints between bases of the pnp transistor group $PG_{11}$, one end of the resistance element $R_{13}$, and the base of the npn transistor $Q_{12}$, the base is connected to both the emitter of the npn transistor $Q_{13}$ and one end of the resistance element $R_{11}$, and the emitter is connected to each of the other end of the resistance element $R_{11}$ and the emitter of the npn transistor $Q_{12}$, respectively.

The connection midpoint between the emitter of the transistor $Q_{11}$ and the other end of the resistance element $R_{11}$ constitutes the node $ND_1$, and is connected to the constant current source $I_{e11}$.

The collector of the npn transistor $Q_{12}$ is connected to the connection midpoint between the bases of the pnp transistor group $PG_{12}$.

The connection midpoint between the collectors of the pnp transistor group $PG_{11}$ is connected to each of the connection midpoints between the collectors of the pnp transistor group $PG_{12}$, the base of the transistor $Q_{M11}$ and the collector of the transistor $Q_{M12}$ of the current mirror circuit MR. The connection midpoint between the emitters is connected to one end of the resistance element $R_{12}$.

The connection midpoint between the emitters of the pnp transistor group PG12 is connected to one end of the resistance element $R_{11}$.

The other ends of the resistance elements $R_{12}$, $R_{13}$, and $R_{14}$ are connected to the power source voltage $V_{CC}$. With regard to the resistance value of these resistance elements $R_{12}$, $R_{13}$, and $R_{14}$, for instance, the resistance value of the resistance element $R_{12}$ is set at 2 kΩ, the resistance value of the resistance element $R_{13}$ is set at 50 kΩ, and the resistance value of the resistance element $R_{14}$ is set at 200 kΩ.

The collector of the transistor $Q_{M11}$ of the current MR mirror circuit is connected to the power source voltage $V_{CC}$, and the emitter is connected to both the base of the transistor $Q_{M12}$ and the connection midpoints between the bases of the transistors $Q_{M13}$–$Q_{M15}$. Both the emitter of the transistor $Q_{M12}$ and the connection midpoints between the emitters of the transistors $Q_{M13}$–$Q_{M15}$ are grounded, and the connection midpoint between the collectors of the transistors $Q_{M13}$–$Q_{M15}$ is connected to the IC terminal $T_1$.

Figure 5:
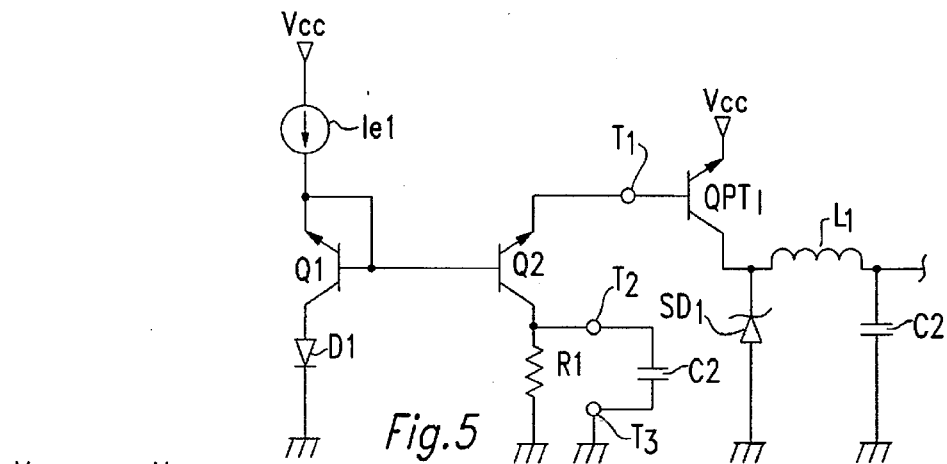
FIG. 5 is a circuit diagram of a conventional overdrive circuit.

The IC terminal $T_1$ is connected to the base of the external pnp transistor $QPT_1$. The emitter of the external pnp transistor $QPT_1$ is connected to the power source voltage $V_{CC}$, and the collector is connected to both the Schottky diode $SD_1$ and the coil $L_1$ in the same way as in FIG. 5.

The operation of the aforementioned structure will be explained next.

First, when the electric current starts flowing in the current source $I_{e11}$, and the voltage of the node $ND_1$ starts decreasing, since the resistance element $R_{11}$ is connected between the base and the emitter of the transistor $Q_{11}$, and the resistance element $R_{13}$ is connected to the base of the transistor $Q_{12}$ from the power source voltage $V_{CC}$, between the transistors $Q_{11}$ and $Q_{12}$, the transistor $Q_{12}$ will be first to conduct.

Since the collector of the transistor $Q_{12}$ is connected to the connection midpoint between the bases of the pnp transistor group $PG_{12}$, accompanying the fact that the transistor $Q_{12}$ is on, the base current will flow into the pnp transistor group $PG_{12}$.

Here, if the current flowing in the resistance element $R_{11}$ and the transistor $Q_{13}$ is ignored, the current $I_{e12}$ will flow in the emitter of the transistor $Q_{12}$ until the electric potential of the node $ND_1$ reaches $(V_{CC}-2V_{SE})$.

Suppose the saturation voltage $V_{CESATQ12}$ of the transistor $Q_{12}$ is 0.1 V, the voltage $V_{14}$ applied to the resistance element $R_{14}$ will be as in the following formula:

$$V_{14} = V_{BEQ13} + V_{BEQ11} - V_{CESATQ12} - V_{BEPG12} \quad (1)$$
$$= 0.7 + 0.7 - 0.1 - 0.7$$
$$= 0.6$$

Thus, supposing the current amplification factor $h_{fe}$ of the pnp transistor group $PG_{12}$ is infinite, the current $I_{PG12}$ of the value indicated by the following formula will flow in the collector of the pnp transistor group $PG_{12}$ as overdrive current:

$$I_{PG12}2=0.6 V/R_{14V}, \quad (2)$$

where $R_{14V}$ indicates the resistance value of the resistance element $R_{14}$.

However, in actuality, since the operation is transient, the value of the collector current $I_{PG12}$ of the pnp transistor group $PG_{12}$ will be smaller than the value given by formula (2).

This overdrive current will receive an amplification function in the current mirror circuit MR, and be supplied to the base of the external transistor $QPT_1$ via the IC terminal $T_1$.

When the amplified overdrive current is supplied, the rise of the collector voltage $V_{P1}$ of the external transistor $QPT_1$ will suddenly change; thus, the high speed operation will be realized, and the conversion efficiency will increase.

When the electric potential of the node $ND_1$ reaches $(V_{CC}-2V_{BE})$, the transistor $Q_{11}$ will be on.

Since the collector of the transistor $Q_{11}$ is connected to the base of the transistor $Q_{12}$, when the transistor $Q_{11}$ is on, consequently, the transistor $Q_{12}$ will be switched from on to off.

As a result, the pnp transistor group $PG_{12}$ will be off, and the supply of overdrive current by the pnp transistor group $PG_{12}$ will be stopped.

Since the collector of the transistor $Q_{11}$ is connected to the connection midpoint between the bases of the pnp transistor group $PG_{11}$, when the transistor $Q_{11}$ is on, consequently, the pnp transistor group $PG_{11}$ will be on.

As a result, the current $I_{PG11}$ will flow in the collector of the pnp transistor group $PG_{11}$ as ordinary current.

Suppose the saturation voltage $V_{CESATQ11}$ of the transistor $Q_{11}$ is 0.1 V, the voltage $V_{12}$ applied to the resistance element $R_{12}$ will be as indicated by the following formula:

$$V_{12} = V_{BEQ13} + V_{BEQ11} - V_{CESATQ11} - V_{BEPG11} \quad (3)$$
$$= 0.7 + 0.7 - 0.1 - 0.7$$
$$= 0.6$$

Thus, supposing the current amplification factor $h_{fe}$ of the pnp transistor group $PG_{11}$ is infinite, the value of the ordinary current $I_{PG11}$ which flows in the collector of the pnp transistor group $PG_{11}$ is given by the following formula:

$$I_{PG11}=0.6V/R_{12V}, \quad (4)$$

where $R_{12V}$ indicates the resistance value of the resistance element $R_{12}$.

This ordinary current receives an amplification function in the current mirror circuit MR, and is supplied to the base of the external transistor $QPT_1$ via the IC terminal $T_1$.

As described above, in this circuit, the overdrive current is determined by the resistance element $R_{14}$, and the ordinary current is determined by the resistance element $R_{12}$.

Figure 2:
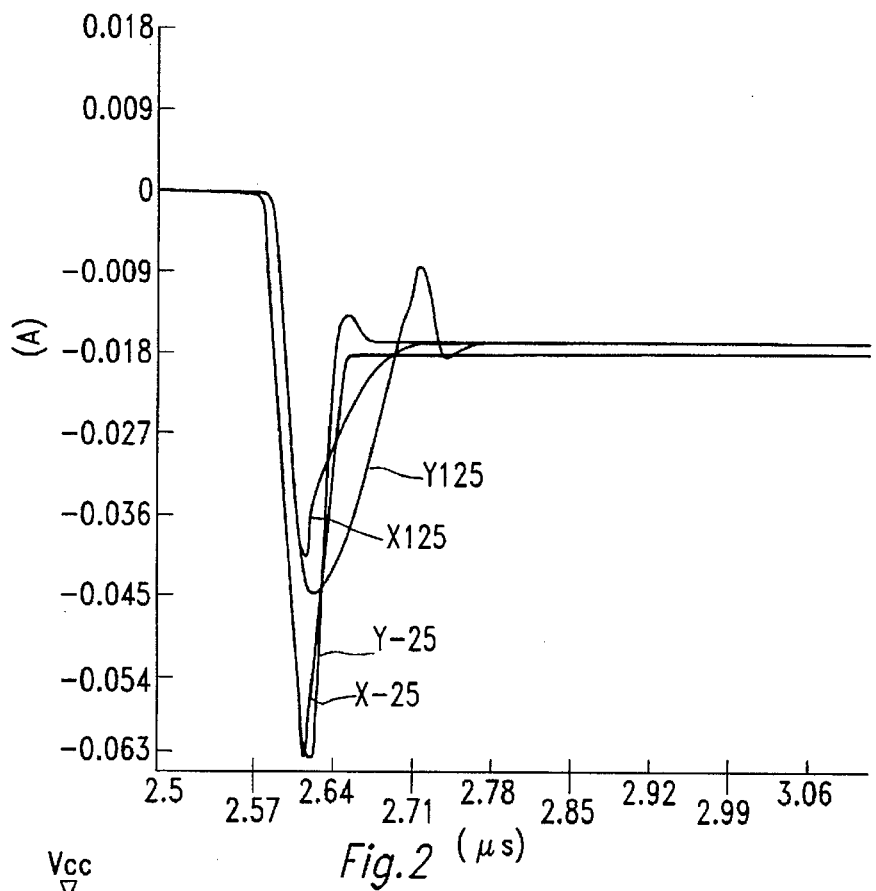
FIG. 2 is a graph illustrating the result of simulation by the circuit in FIG. 1 which does not use any external capacitor and by a conventional circuit.

FIG. 2 is a graph illustrating the result of a simulation both by the circuit in FIG. 1 which does not use an external capacitor and a conventional circuit which uses an external capacitor.

This simulation was made under the atmosphere of the ambient temperatures of 125° C. and −25° C.

In FIG. 2, the horizontal coordinate indicates the time (μsec) and the vertical coordinate indicates the base current (A) of the external transistor $QPT_1$, respectively.

In FIG. 2, the curve of thick solid line labeled $X_{125}$ is the result of simulation by the circuit in FIG. 1 under an atmosphere of 125° C., the curve of thick solid line labeled $X_{-25}$ is the result of simulation by the circuit in FIG. 1 under an atmosphere of −25° C., the curve of thin solid line labeled $Y_{125}$ is the result of simulation by a conventional circuit under an atmosphere of 125° C., and the curve of thin solid line labeled $Y_{-25}$ is the result of simulation by a conventional circuit under an atmosphere of −25° C.

As can be observed in FIG. 2, the circuit in FIG. 1 can induce overdrive current in a good condition, and consequently it can realize a high-speed operation, and can improve the conversion efficiency.

As explained above, in this embodiment, since overdrive current can be induced in a good condition only with a logical circuit without using an external capacitance, the number of external parts can be reduced without increasing the chip area or the IC cost.

The overdrive current and the ordinary current can be set separately by the resistance elements $R_{14}$, and $R_{12}$, respectively; thus, for instance, setting can be made arbitrarily using an external resistance element, etc.

In this embodiment, the number of transistors which the pnp transistor groups $PG_{11}$ and $PG_{12}$ connect was three. However, the number of such transistor connecting is not limited to this embodiment.

That is, if it is possible for a large volume of current to flow to the base of the external transistor $QPT_1$, one transistor will be enough. The number will be determined by the manufacturing process, etc.

Figure 3:
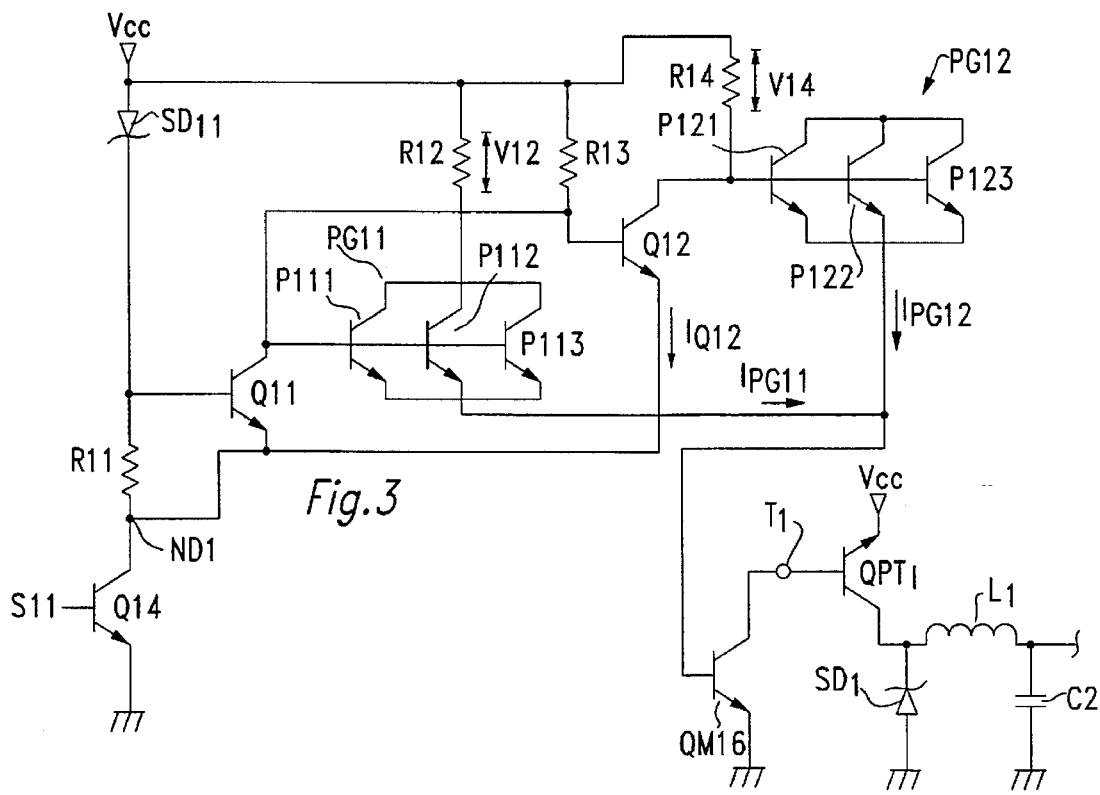
FIG. 3 is a circuit diagram of a second embodiment of an overdrive circuit in accordance with the invention.

FIG. 3 is a circuit diagram of a second embodiment of an overdrive circuit in accordance with the invention.

This second embodiment of FIG. 3 is different from the first embodiment of FIG. 1 in terms of the following points. Instead of the transistor Q13, this circuit is configured by the Schottky diode $SD_{11}$. The current source $I_{e11}$ is configured by the npn transistor $Q_{14}$ where the external signal $S_{11}$ is supplied to the base. The current mirror circuit MR is configured by one npn transistor $QM_{16}$.

In this configuration, the base of the npn transistor $QM_{16}$ is connected to the connection midpoint between the collectors of the pnp transistor groups $PG_{11}$ and $PG_{12}$, the collector is connected to the IC terminal $T_1$, and the emitter is grounded.

The other configuration is the same as that of the first embodiment. The same effect as that of the first embodiment can be obtained.

Figure 4:
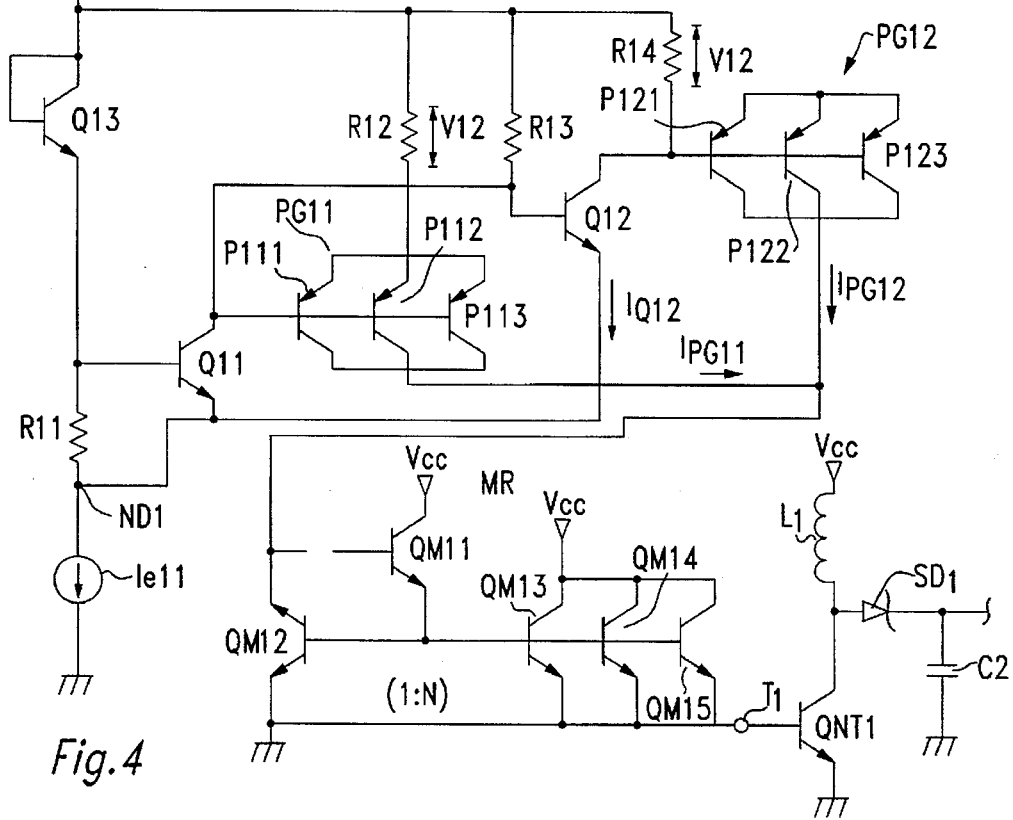
FIG. 4 is a circuit diagram of a third embodiment of an overdrive circuit in accordance with the invention.

FIG. 4 is a circuit diagram of a third embodiment of an overdrive circuit in accordance with the invention.

The third embodiment of FIG. 4 is different from the first embodiment of FIG. 1 in terms of the following points: This circuit is configured by the npn transistor $QNT_1$ instead of the pnp transistor $QPT_1$ as the external transistor, and the connection midpoint between the emitters of the transistors $Q_{M12}$–$Q_{M15}$ of the current mirror circuit MR is connected to the IC terminal $T_1$.

While the first embodiment of FIG. 1 is a decreasing pressure chopper circuit, the third embodiment of FIG. 4 is an increasing pressure chopper circuit. The emitter of the transistor $QNT_1$ is grounded, and the collector is connected to one end of the coil $L_1$ and the anode of the diode $SD_1$.

In this embodiment, the fall of the collector potential of the transistor $QNT_1$ will be fast; thus, the high speed operation of the circuit can be realized and the conversion efficiency can be improved in a similar fashion to the first embodiment.

As explained above, with this invention, the overdrive current can be induced in a good condition with only a logic circuit without using any external capacitor, and the number of external parts can be reduced without increasing the chip area or the IC cost.

Also, with this invention, the overdrive current can be supplied to the switching element by means of a circuit configured by transistors, resistance elements, etc., without using the charge-discharge current of the capacitor; thus, the effects that the manufacture of semiconductor integrated circuits will be easier, the cost will be lower, and the whole circuit can be integrated in one semiconductor chip, etc., can be obtained.

I claim:

1. An integrated overdrive circuit formed on a single semiconductor chip comprising:
    a first current source for supplying a first current;
    a first circuit connected to said first current source and operating said first current source for a predetermined time period to provide the first current as an overdrive current for driving a switching element;
    a second current source for supplying a second current smaller in magnitude than the first current; and
    a second circuit connected to said first circuit for stopping the operation of said first circuit after the predetermined time period has elapsed to stop said first current source from providing the overdrive current;
    said second circuit also being connected to said second current source and operating said second current source to provide the second current as an ordinary current for driving the switching element.

2. An overdrive circuit as set forth in claim 1, wherein said first current source comprises a first plurality of bipolar transistors having respective base, collector and emitter electrodes and arranged in parallel relationship with respect to each other with the bases, collectors and emitters of the first plurality of bipolar transistors being respectively connected together;
    said first circuit connected to said first current source including a bipolar transistor having base, collector and emitter electrodes, the base of said first circuit bipolar transistor being connectable to a voltage supply source and having the collector thereof connected to the commonly connected bases of said first plurality of bipolar transistors of said first current source; and
    said first circuit bipolar transistor being conductive over the predetermined time period for rendering the first plurality of bipolar transistors included in said first current source conductive so as to provide the first current as the overdrive current for driving the switching element.

3. An overdrive circuit as set forth in claim 2, wherein said second current source for supplying the second current smaller in magnitude than the first current comprises a second plurality of bipolar transistors having base, collector and emitter electrodes and arranged in parallel relationship with respect to each other with the bases, collectors and emitters of the second plurality of bipolar transistors being respectively connected together;
    said second circuit including a second circuit bipolar transistor having base, collector and emitter electrodes, the base of said second circuit bipolar transistor being connectable to the voltage supply source, and the collector of said second circuit bipolar transistor being connected to a node located in the connection between the voltage supply source and the base of said first circuit bipolar transistor;
    said second circuit bipolar transistor being rendered conductive in response to a rise in voltage at the base thereof and drawing current from the voltage supply source through the collector thereof so as to lower the voltage applied to the base of said first circuit bipolar transistor for turning off said first circuit bipolar transistor to render said first circuit bipolar transistor nonconductive;
    said first plurality of bipolar transistors defining said first current source being rendered nonconductive to stop said first current source from providing the overdrive current in response to said first circuit bipolar transistor being rendered nonconductive; and
    said second circuit bipolar transistor, when conductive, rendering said second plurality of bipolar transistors defining said second current source conductive so as to operate said second current source to provide the second current as the ordinary current for driving the switching element.

4. An overdrive circuit as set forth in claim 1, further including first and second resistors respectively disposed in the connection between the voltage supply source and said first and second current sources;

said first resistor being determinative of the magnitude of the overdrive current provided by said first current source, and said second resistor being determinative of the magnitude of the ordinary current provided by said second current source.

5. An overdrive circuit as set forth in claim 1, wherein said first and second current sources have their respective outputs connected to a common node;

a current mirror circuit having an input and an output, the input of said current mirror circuit being connected to the common node to which the outputs of said first and second current sources are connected; and an output terminal connected to the output of said current mirror source and adapted to be connected to the switching element to be driven.

6. An overdrive circuit as set forth in claim 5, wherein said current mirror circuit includes a plurality of bipolar transistors having commonly connected base, collector and emitter electrodes; and an actuator bipolar transistor having base, collector and emitter electrodes, the collector of said actuator bipolar transistor being connectable to the voltage supply source, the base of said actuator bipolar transistor being connected to the common node connecting the outputs of said first and second current sources, and the emitter being connected to the commonly connected bases of said plurality of bipolar transistors included in said current mirror circuit;

said actuator bipolar transistor being rendered conductive in response to the application of either of the first or second current as respectively provided by said first and second current sources to the base thereof to turn on said plurality of bipolar transistors for rendering said current mirror circuit operative to provide a driving current at the output terminal.

7. An overdrive circuit as set forth in claim 5, wherein said current mirror circuit comprises a single bipolar transistor having base, collector and emitter electrodes;

the base of said single bipolar transistor defining said current mirror circuit being connected to the common node to which the outputs of said first and second current sources are connected; and said single bipolar transistor defining said current mirror circuit being rendered conductive in response to the application of either of the first or second current as respectively provided by said first and second current sources to the base thereof to provide a driving current at the output terminal.

8. An overdrive circuit as set forth in claim 6, wherein the output from said current mirror circuit is applied to said output terminal via the collectors of said plurality of bipolar transistors included in said current mirror circuit.

9. An overdrive circuit as set forth in claim 6, wherein the output from said current mirror circuit is applied to said output terminal via the emitters of said plurality of bipolar transistors included in said current mirror circuit.

* * * * *

US005642001C1

(12) EX PARTE REEXAMINATION CERTIFICATE (7162nd)

United States Patent
Miyazaki

(10) Number: US 5,642,001 C1
(45) Certificate Issued: Nov. 17, 2009

(54) OVERDRIVE CIRCUIT

(75) Inventor: Takahiro Miyazaki, Haji-machi (JP)

(73) Assignee: Texas Instruments Incorporated, Dallas, TX (US)

Reexamination Request:
No. 90/010,172, May 21, 2008
No. 90/010,267, Sep. 3, 2008

Reexamination Certificate for:
Patent No.: 5,642,001
Issued: Jun. 24, 1997
Appl. No.: 08/324,835
Filed: Oct. 18, 1994

(51) Int. Cl.
*H03K 17/08* (2006.01)

(52) U.S. Cl. .................. 307/43; 307/141; 307/141.4; 307/141.8; 327/108; 327/109; 327/289; 326/62; 326/207; 330/207

(58) Field of Classification Search .................. None
See application file for complete search history.

(56) References Cited

U.S. PATENT DOCUMENTS

| | | | |
|---|---|---|---|
| 5,089,719 A | 2/1992 | Kamei et al. | 327/109 |
| 5,185,538 A | 2/1993 | Kondoh et al. | 327/109 |
| 5,270,585 A | 12/1993 | Tisinger | 326/82 |

*Primary Examiner*—Linh M. Nguyen

(57) ABSTRACT

An overdrive circuit having a first current source which supplies an overdrive current and a second current source which supplies an ordinary current smaller than the overdrive current. A first circuit operates the first current source that supplies the overdrive current for a predetermined time period after the start of current supply. A second circuit stops the action of the first current source after the predetermined time period has passed and drives the second current source to supply the ordinary current as the driving current.

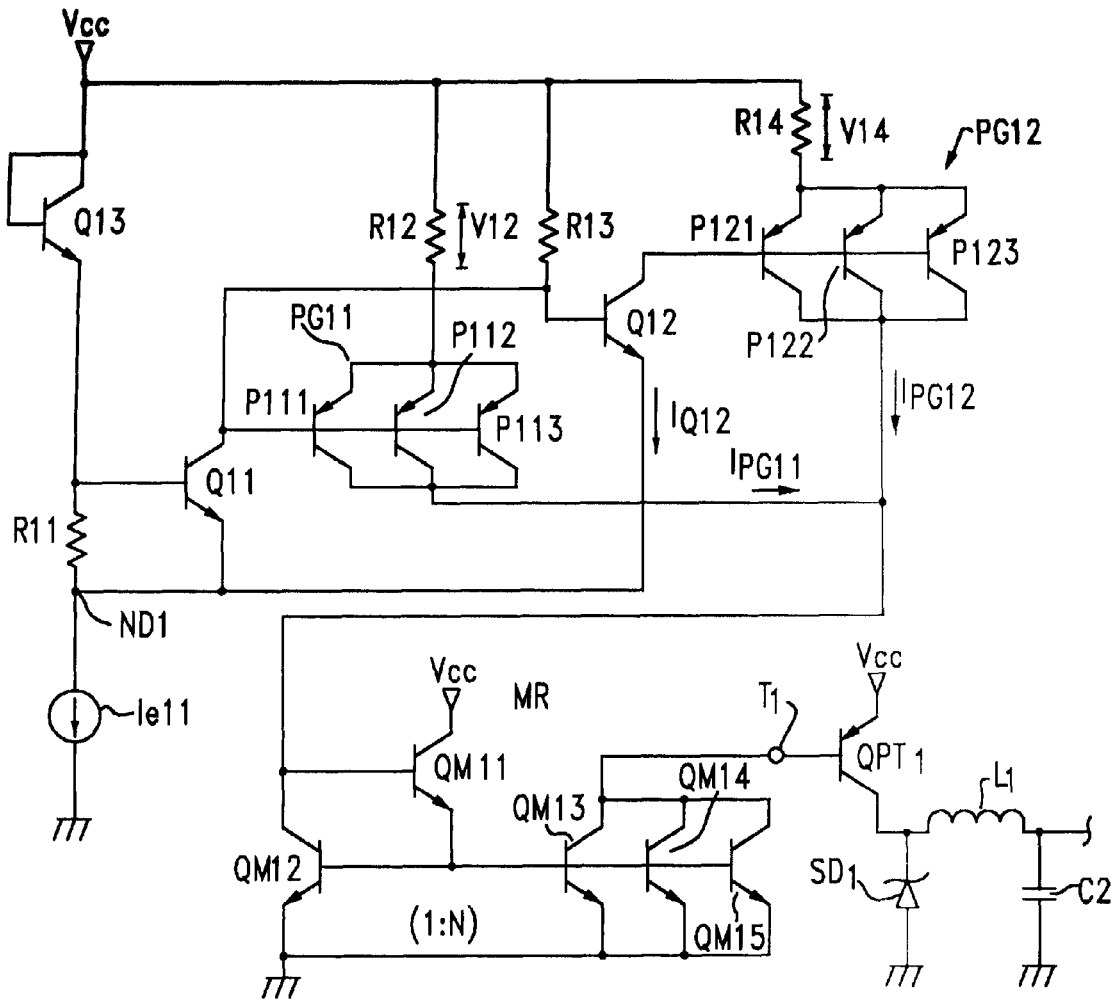

US 5,642,001 C1

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

ONLY THOSE PARAGRAPHS OF THE SPECIFICATION AFFECTED BY AMENDMENT ARE PRINTED HEREIN.

Figure 8:
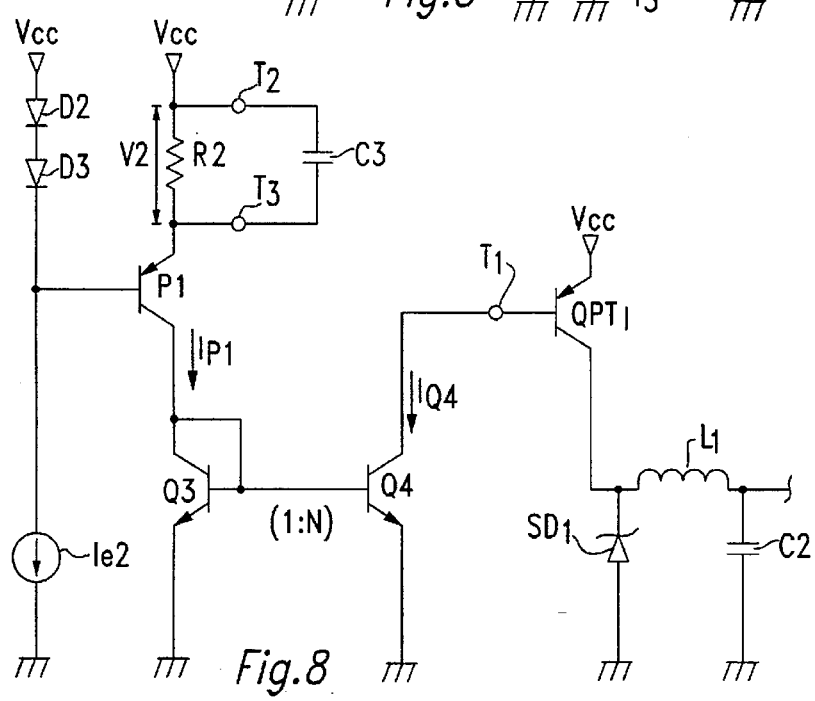
FIG. 8 is a circuit diagram of a second conventional overdrive circuit.
Figure 6:
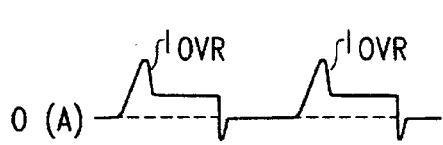
FIG. 6 is a waveform illustrating the base current of an external transistor in the circuit of FIG. 5.
Figure 7:
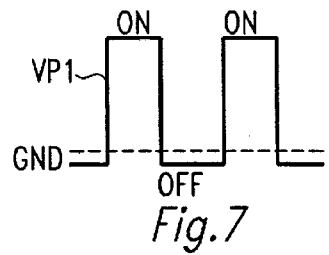
FIG. 7 is a waveform illustrating the collector voltage of the external transistor.
Figure 9:
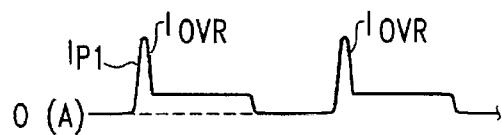
FIG. 9 is a waveform illustrating the collector current of the transistor $P_1$ in the circuit of FIG. 8.
Figure 1:
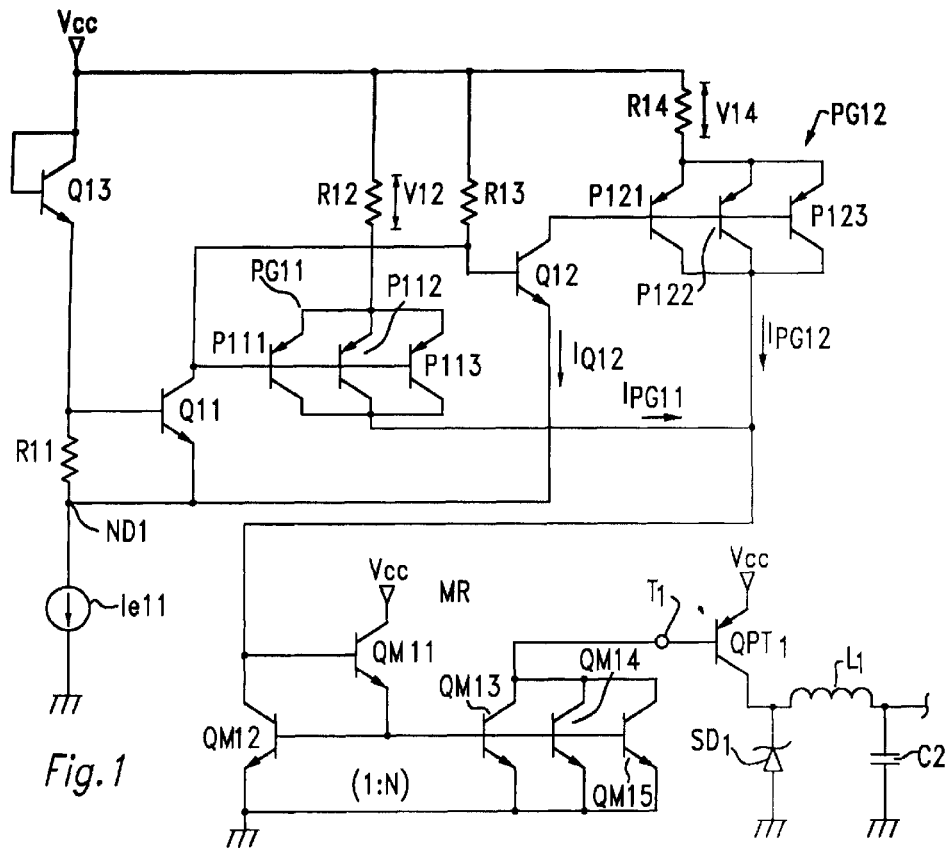
Figure 3:
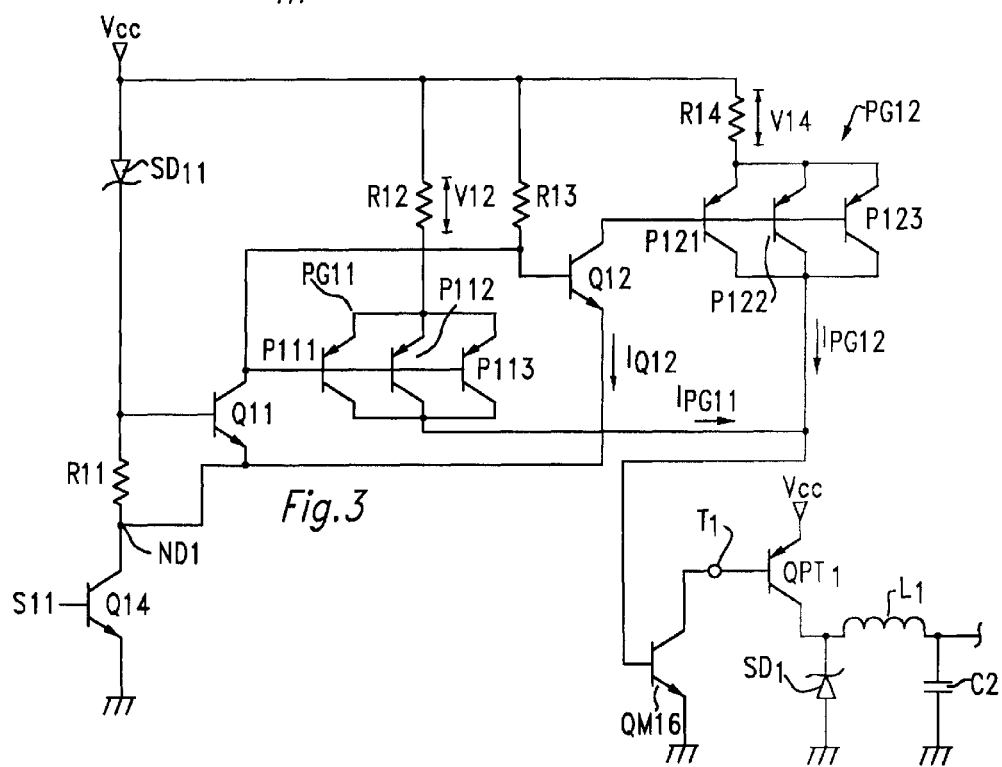

Column 2, lines 37–42:

In the circuit in FIG. 8, when the electric current from the current source $I_{e2}$ begins to flow, in the initial state, during the time while the charge of the external capacitor $C_3$ flows out via the transistor $P_1$, the overdrive current $I_{OVR}$ as illustrated in FIG. 9 will flow [into] *out of* the collector of the transistor $P_1$.

Column 4, lines 40–47:

The collector of the npn transistor $Q_{11}$ is connected to each of the connection midpoints between bases of the pnp transistor group $PG_{11}$, one end of the resistance element $R_{13}$, and the base of the npn transistor $Q_{12}$, the base *of $Q_{11}$ is* connected to both the emitter of the npn transistor $Q_{13}$ and one end of the resistance element $R_{11}$, and the emitter *of $Q_{11}$* is connected to each of the other end of the resistance element $R_{11}$ and the emitter of the npn transistor $Q_{12}$, respectively.

Column 4, lines 56–62:

The connection midpoint between the collectors of the pnp transistor group $PG_{11}$ is connected to each of the connection midpoints between the collectors of the pnp transistor group $PG_{12}$, the base of the transistor $Q_{M11}$ and the collector of the transistor $Q_{M12}$ of the current mirror circuit MR. The connection midpoint between the emitters *of $PG_{11}$* is connected to one end of the resistance element $R_{12}$.

Columnn 4, lines 63–65:

The connection midpoint between the emitters of the pnp transistor group PG12 is connected to one end of the resistance element [$R_{11}$] *$R_{14}$*.

Column 5, lines 31–35:

Since the collector of the transistor $Q_{12}$ is connected to the connection midpoint between the bases of the pnp transistor group $PG_{12}$, accompanying the fact that the transistor $Q_{12}$ is on, the base current will flow [into] *out of* the pnp transistor group $PG_{12}$.

Column 5, lines 36–39:

Here, if the current flowing in the resistance element $R_{11}$ and the transistor $Q_{13}$ is ignored, the current $I_{e12}$ will flow in the emitter of the transistor $Q_{12}$ until the electric potential of the node $ND_1$ reaches [$(V_{CC}-2V_{SE})$] *$(V_{CC}-2V_{BE})$*.

Column 5, line 53:

$$I_{PG12}[2]=0.6\,V/R_{14}, \quad (2)$$

THE DRAWING FIGURES HAVE BEEN CHANGED AS FOLLOWS:

In FIG. 1 V12 (across R14) has been changed to V14.

AS A RESULT OF REEXAMINATION, IT HAS BEEN DETERMINED THAT:

Claim 1 is determined to be patentable as amended.

New claims 10–20 are added and determined to be patentable.

Claims 2–9 were not reexamined.

1. An integrated overdrive circuit formed on a single semiconductor chip comprising:
    a first current source for supplying a first current;
    a first circuit connected to said first current source and operating said first current source for a predetermined time period to provide the first current as an overdrive current for driving a switching element;
    a second current source for supplying a second current smaller in magnitude than the first current; and
    a second circuit connected to said first circuit for stopping the operation of said first circuit after the predetermined time period has elapsed to stop said first current source from providing the overdrive current;
    said second circuit also being connected to said second current source and operating said second current source to provide the second current as an ordinary current for driving the switching element;
    *said first circuit comprises a first switching circuit and said first switching circuit controlling when said first current source supplies said first current;*
    *said second circuit comprises a second switching circuit and said second switching circuit controlling when said second current source supplies said second current;*
    *said first switching circuit is switched on before said second switching circuit is switched on.*

10. *An overdrive circuit as set forth in claim 1, wherein said first switching circuit comprises a bipolar transistor.*

11. *An overdrive circuit as set forth in claim 1, wherein said second switching circuit comprises a bipolar transistor.*

12. *An overdrive circuit as set forth in claim 1, wherein said second switching circuit is activated after the predetermined time period has elapsed.*

13. *An overdrive circuit as set forth in claim 1, when said second switching circuit is switched on, the first switching circuit will be switched from on to off.*

14. *An overdrive circuit as set forth in claim 13, said second switching circuit being switched on causes the first switching circuit to be switched from on to off.*

15. *An integrated overdrive circuit formed on a single semiconductor chip comprising:*
    *a first current source for supplying a first current;*
    *a first circuit connected to said first current source and operating said first current source for a predetermined time period to provide the first current as an overdrive current for driving a switching element;*
    *a second current source for supplying a second current smaller in magnitude than the first current; and*
    *a second circuit connected to said first circuit for stopping the operation of said first circuit after the predetermined time period has elapsed to stop said first current source from providing the overdrive current;* said second circuit also being connected to said second current source and operating said second current source to provide the second current as an ordinary current for driving the switching element, said ordinary current driving the switching element after said first current source has stopped providing the overdrive current;

said first circuit comprises a first switching circuit and said first switching circuit controlling when said first current source supplies said first current;

said second circuit comprises a second switching circuit and said second switching circuit controlling when said second current source supplies said second current;

said first switching circuit is switched on before said second switching circuit is switched on.

16. An overdrive circuit as set forth in claim 15, wherein said first switching circuit comprises a bipolar transistor.

17. An overdrive circuit as set forth in claim 15, wherein said second switching circuit comprises a bipolar transistor.

18. An overdrive circuit as set forth in claim 15, wherein said second switching circuit is activated after the predetermined time period has elapsed.

19. An overdrive circuit as set forth in claim 15, when said second switching circuit is switched on, the first switching circuit will be switched from on to off.

20. An overdrive circuit as set forth in claim 19, said second switching circuit being switched on causes the first switching circuit to be switched from on to off.

* * * * *